United States Patent
Song

(10) Patent No.: US 7,085,171 B2
(45) Date of Patent: Aug. 1, 2006

(54) SEMICONDUCTOR MEMORY DEVICE

(75) Inventor: Seong-Hwi Song, Ichon-shi (KR)

(73) Assignee: Hynix Semiconductor Inc., Kyougk-do (KR)

( * ) Notice: Subject to any disclaimer, the term of this patent is extended or adjusted under 35 U.S.C. 154(b) by 0 days.

(21) Appl. No.: 11/017,670

(22) Filed: Dec. 22, 2004

(65) Prior Publication Data

US 2006/0023533 A1   Feb. 2, 2006

(30) Foreign Application Priority Data

Jul. 27, 2004  (KR) .................... 10-2004-0058817

(51) Int. Cl.
*G11C 7/00* (2006.01)
(52) U.S. Cl. ............................... 365/189.02
(58) Field of Classification Search ............... None
See application file for complete search history.

(56) References Cited

U.S. PATENT DOCUMENTS 5,504,875 A * 4/1996 Mills et al. .............. 711/171
5,896,347 A * 4/1999 Tomita et al. ............. 365/233
5,978,284 A * 11/1999 Pawlowski ................ 365/194
6,097,640 A   8/2000 Fei et al.
6,128,770 A   10/2000 Agrawal et al.
6,157,560 A   12/2000 Zheng
6,735,135 B1  5/2004 Issa
6,816,416 B1  11/2004 Won

FOREIGN PATENT DOCUMENTS

JP   2000-011681 A   1/2000
KR   1999-0075864     10/1999

\* cited by examiner

*Primary Examiner*—Tan T. Nguyen
(74) *Attorney, Agent, or Firm*—McDermott Will & Emery LLP

(57) ABSTRACT

A semiconductor memory device including a read and a write structures are provided. The read structure includes: a core sense amplifier part for amplifying data applied on data buses of a core area; a read multiplexing part for multiplexing the output data of the core sense amplifier part according to data width options and transferring the multiplexed data to a peripheral area through data buses; and a data output part for transferring the data of the data buses to a plurality of data I/O pins. The write structure includes: a data input part for transferring data applied on a plurality of data I/O pins to a core area through data buses; a write multiplexing part for multiplexing the data of the data buses according to data width options; and a core driver part for driving the output data of the write multiplexing part to data buses of the core area.

19 Claims, 10 Drawing Sheets

SEMICONDUCTOR MEMORY DEVICE

FIELD OF INVENTION

The present invention relates to a semiconductor memory device; and, more particularly, to a structure of an I/O path for transferring data during a read or write operation.

DESCRIPTION OF PRIOR ART

A semiconductor substrate for a memory device is divided into a core area and a peripheral area. Memory cells for storing data are arranged in the core area, while I/O (input/output) lines and I/O devices are arranged in the peripheral area. Global I/O buses are arranged in the core area. The global I/O buses are relatively long and transfer data from the core area to the peripheral area. A write driver and an I/O sense amplifier are provided at an end portion of the core area of the global lines that constitute the global I/O buses. The write driver amplifies data inputted to the core area and the I/O sense amplifier amplifies data outputted from the core area. The write driver and the I/O sense amplifier, which are disposed at a boundary between the core area and the peripheral area, are classified as a component of the core area or a component of the peripheral area. However, in this specification, the write driver and the I/O sense amplifier will be classified as the component of the core area.

Data bus for transferring data inputted through data I/O pin (DQ) to a memory cell array is generally referred to as a global I/O bus (GIO). The memory cell array includes a hierarchical I/O bus structure for transferring data between bit line bus and global I/O bus.

The write driver is used to drive data applied on the global I/O line (data bus line) to the local I/O line arranged in an inside of the memory cell array. The I/O sense amplifier (IOSA) is used to transfer data applied on the local I/O line to the global I/O line (GIO).

A synchronous DRAM (SDRAM) includes sixteen data I/O pins (DQ) and sixteen global I/O lines and supports data width options of ×4, ×8 and ×16 modes. In the case of the ×8 mode, data applied on the sixteen global I/O lines are inputted/outputted through eight data I/O pins. In the case of the ×4 mode, data applied on the sixteen global I/O lines are inputted/outputted through four data I/O pins.

Meanwhile, in the case of the ×16 mode, data are transferred through the data I/O pins (DQ) and the corresponding global I/O buses (I/O). However, in the case of the ×4 or ×8 mode, since the data I/O pins (DQ) and the global I/O lines (GIO) are not matched with 1:1, a multiplexing process is required for transferring data inputted through the data I/O pins (DQ) to the specific global I/O lines (GIO). This process is performed by data multiplexer (×4 data multiplexer and ×8 data multiplexer).

FIG. 1 is a block diagram of a conventional data write path.

Referring to FIG. 1, a conventional data write path includes a plurality of data I/O pins DQ0 to DQ15, a data input part 11, and a core driver/sense amplifier part 14. The data input part 11 transfers data inputted through the data I/O pins DQ0 to DQ15 to global I/O buses gio<0:15>. The core driver/sense amplifier part 14 includes a plurality of I/O sense amplifiers sa0 to sa15 for sensing data of memory cells and loading the sensed data on the global I/O buses gio<0:15>, and a plurality of write drivers wd0 to wd15 for driving data applied on the data buses gio<0:15> to the memory cell array. The data input part 11 includes a plurality of ×4 data multiplexers DOMUX ×4 and DIMUX ×4, a plurality of ×8 data multiplexers DOMUX ×8 and DIMUX ×8, and a plurality of ×16 data multiplexers DOMUX ×16 and DIMUX ×16.

Although not shown, the data input part 11 includes a data input buffer for buffering data applied on the data I/O pins DQ0 to DQ15, and a data input driver for transferring the output signals of the data multiplexers to the global I/O buses gio<0:15>.

As described above, the conventional data write path includes the plurality of data multiplexers DIMUX ×4, DIMUX ×8, DIMUX ×16, DOMUX ×4, DOMUX ×8 and DOMUX ×8 at the data input part 20, which is arranged at the peripheral area, so as to support the data with options. As described in FIG. 1, the data multiplexers DIMUX ×4, DIMUX ×8, DIMUX ×16, DOMUX ×4, DOMUX ×8 and DOMUX ×16 are connected together very complexly, such that layout area is widely occupied.

Also, several addresses must be inputted according to data input timing so as to control the data multiplexers DIMUX ×4, DIMUX ×8, DIMUX ×16, DOMUX ×4, DOMUX ×8 and DOMUX ×16. Therefore, timing mismatch in the data input may be caused.

In addition, since the data read path uses the multiplexers DIMUX ×16, DIMUX ×8 and DIMUX ×4, the same problem may be incurred.

FIG. 2 is block diagram of another conventional data read/write path using combination read/write data buses. As shown in FIG. 2, since the data multiplexers are disposed at the peripheral area, the same problem described in FIG. 1 may be incurred.

SUMMARY OF INVENTION

It is, therefore, an object of the present invention to provide a semiconductor memory device having a simplified data multiplexing structure on data transfer path.

It is another object of the present invention to provide a semiconductor memory device that can prevent a timing mismatching when data are outputted.

In accordance with an aspect of the present invention, there is provided a semiconductor memory device including: a core sense amplifier part for amplifying data applied on data buses of a core area; a read multiplexing part for multiplexing the output data of the core sense amplifier part according to data width options and transferring the multiplexed data to a peripheral area through data buses; and a data output part for transferring the data of the data buses to a plurality of data I/O pins.

In accordance with another aspect of the present invention, there is provided a semiconductor memory device including: a data input part for transferring data applied on a plurality of data I/O pins to a core area through data buses; a write multiplexing part for multiplexing the data of the data buses according to data width options; and a core driver part for driving the output data of the write multiplexing part to data buses of the core area.

In accordance with a further another aspect of the present invention, there is provided a semiconductor memory device having a read structure and a write structure, wherein the read structure includes: a core sense amplifier part for amplifying data applied on data buses of a core area; a read multiplexing part for multiplexing the output data of the core sense amplifier part according to data width options and transferring the multiplexed data to a peripheral area through data buses; and a data output part for transferring the data of the data buses to a plurality of data I/O pins, and wherein the write structure includes: a data input part for transferring data applied on a plurality of data I/O pins to a core area through data buses; a write multiplexing part for multiplexing the data of the data buses according to data width options; and a core driver part for driving the output data of the write multiplexing part to data buses of the core area.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device having a column address path therein in accordance with the present invention will be described in detail referring to the accompanying drawings.

EMBODIMENT 1

Generally, a semiconductor memory device has a maximum data width number $N(=2^P$, where P is positive integers) and a minimum data width number $M(=2^Q$, where Q is positive integers) The maximum data width is sequentially reduced by half to reach the minimum data width. Accordingly, in this case, the semiconductor memory device has $K(=P-Q+1)$ data width options in total. In this embodiment, since the maximum data width is 16 and the minimum data width is 4, three option signals (×16, ×8 and ×4) are received.

Figure 1:
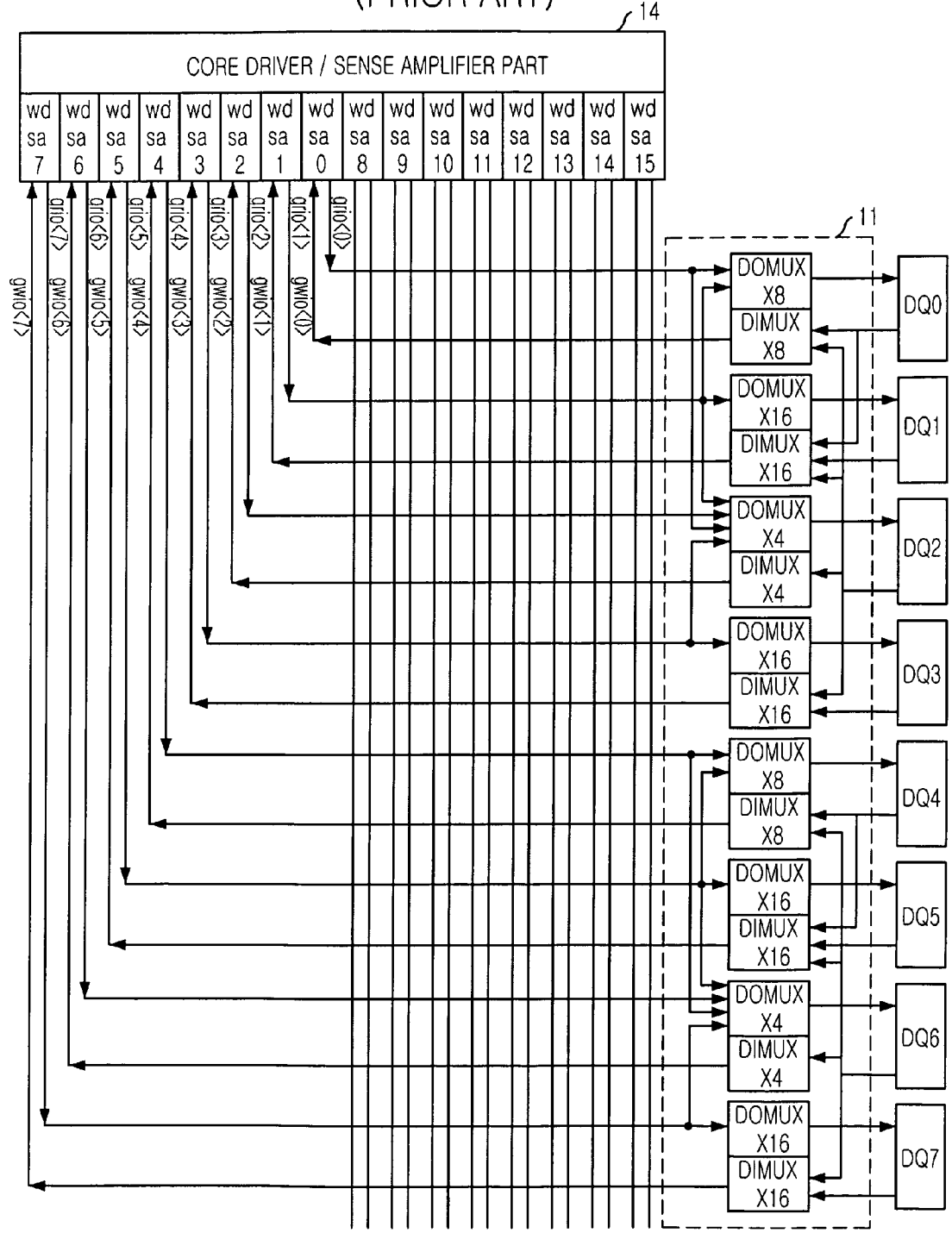
FIG. 1 is a block diagram showing a data I/O path of a conventional semiconductor memory device.
Figure 2:
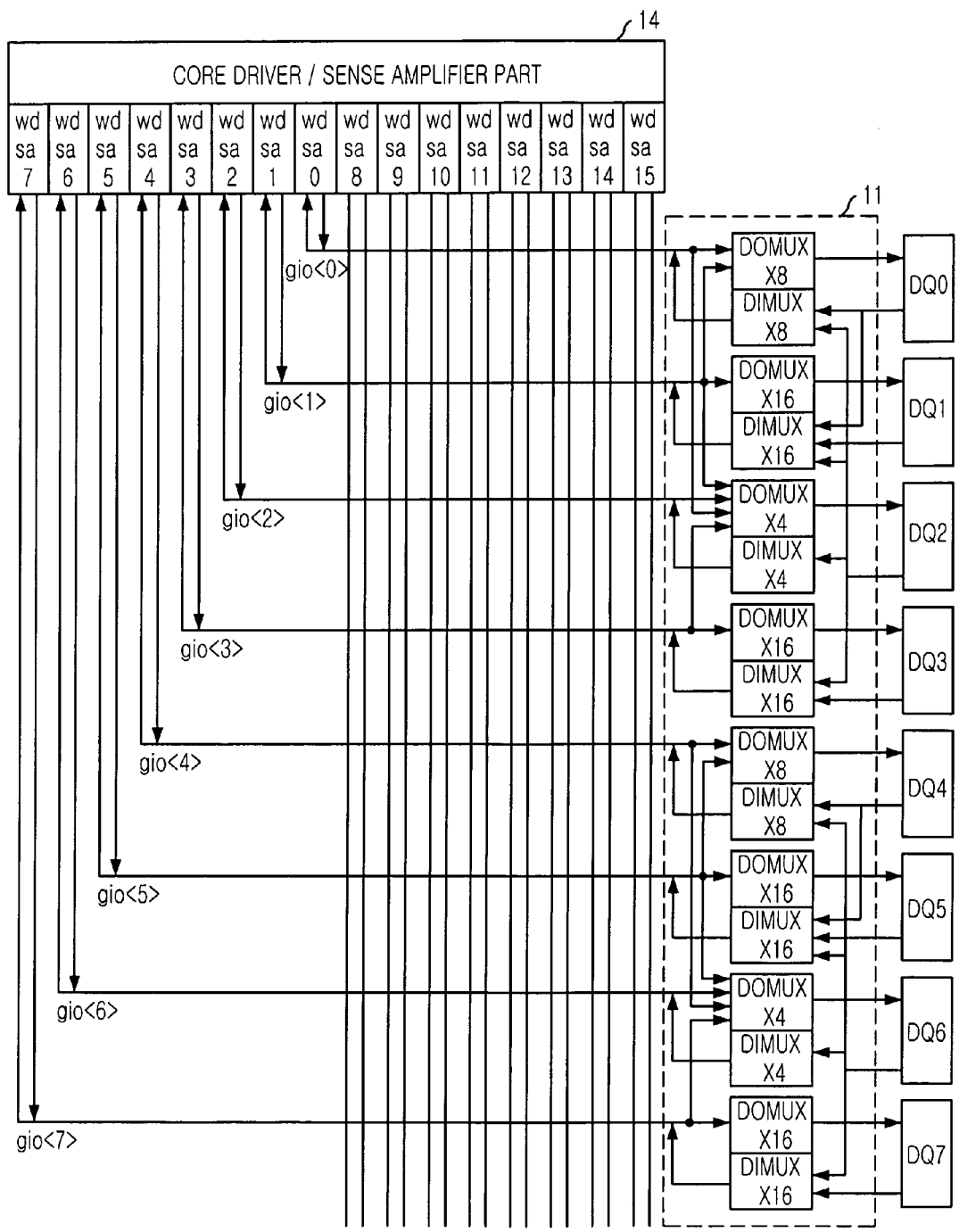
FIG. 2 is a block diagram showing another data I/O path of a conventional semiconductor memory device.
Figure 3:
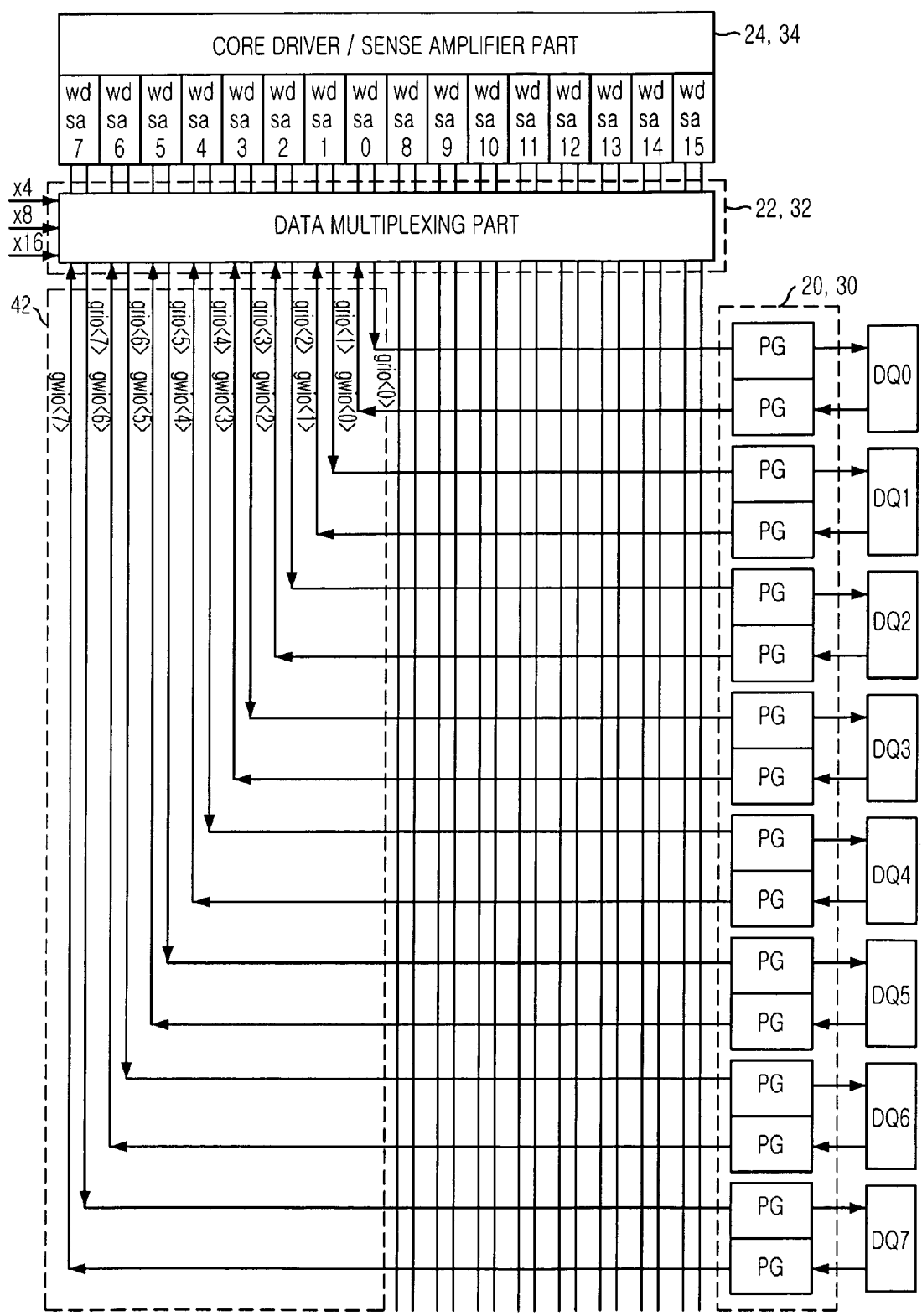
FIG. 3 is a block diagram illustrating a data I/O path of a semiconductor memory device in accordance with an embodiment of the present invention.

FIG. 3 is a block diagram illustrating a data I/O path of a semiconductor memory device in accordance with an embodiment of the present invention.

Figure 6:
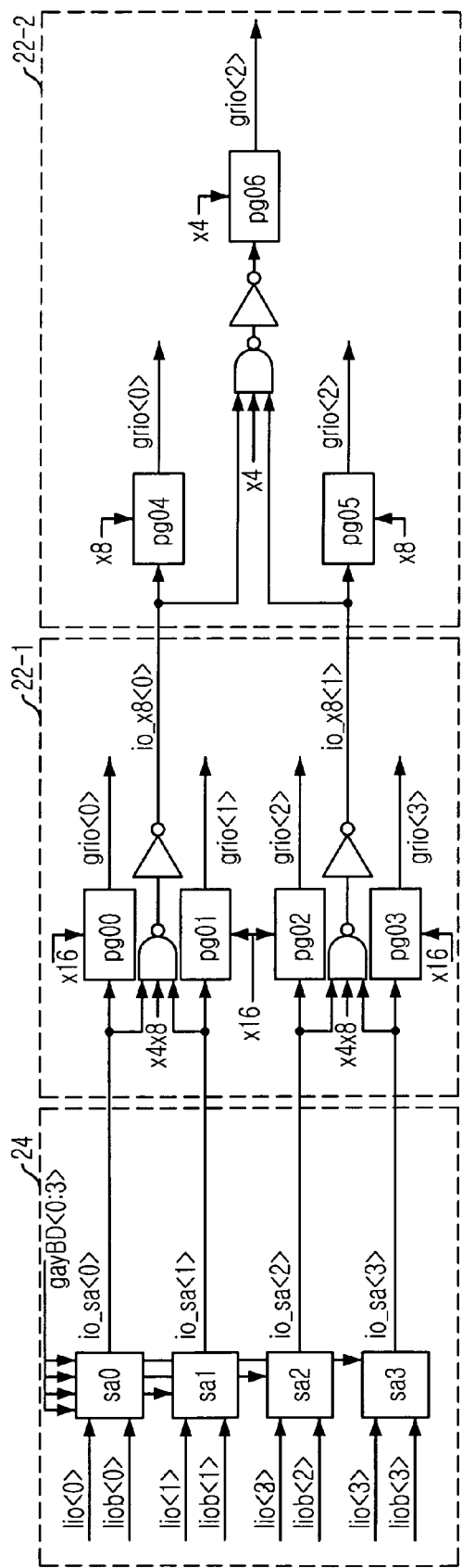
FIG. 6 is a block diagram of a data write path of a semiconductor memory device in accordance with an embodiment of the present invention.

As shown in FIG. 3, the semiconductor memory device in accordance with the present invention is characterized in that a read/write multiplexing part is disposed in a core area. A data read path and a data write path are arranged physically at the same region. However, for the sake of convenience, the read and write paths are divided into a read structure consisting of components of the read path and a write structure consisting of components of the write path, as shown in FIGS. 4 and 6.

Figure 4:
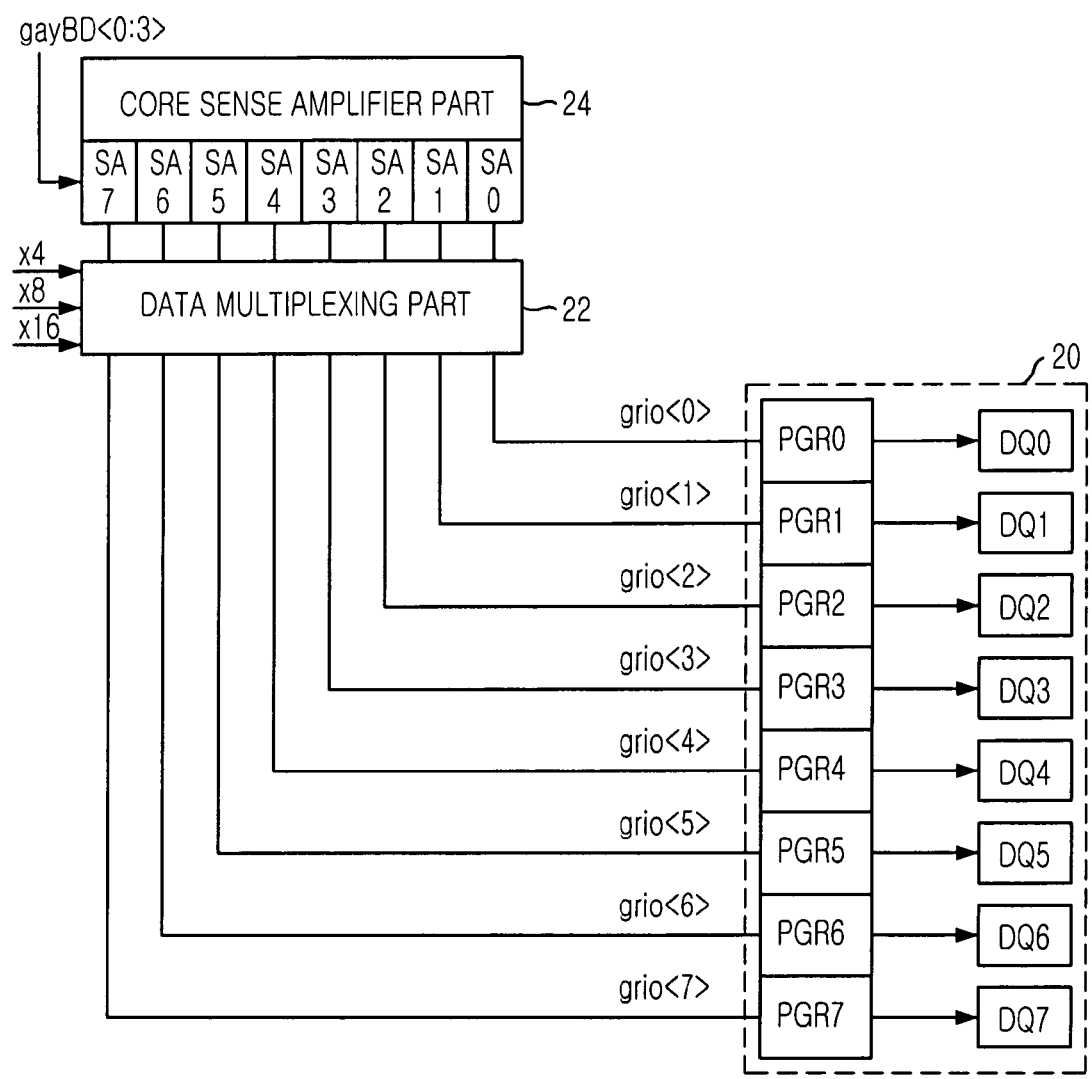
FIG. 4 is a block diagram illustrating a data read path of a semiconductor memory device in accordance with an embodiment of the present invention.

FIG. 4 is a block diagram illustrating a data read path of a semiconductor memory device in accordance with an embodiment of the present invention.

Referring to FIG. 4, a read structure of a semiconductor memory device in accordance with an embodiment of the present invention includes a core sense amplifier part 24, a read multiplexing part 22, and a data output part 20.

The core sense amplifier part 24 amplifies data applied on local I/O buses of a core area. The read multiplexing part 22 multiplexes the output data of the core sense amplifier part according to data width option and transfers the data through read I/O buses to a peripheral area. The data output part 20 transfers the data applied on the read I/O buses to a plurality of data I/O pins.

Also, the core sense amplifier part 24 includes a plurality (preferably, the number of the maximum data width) of I/O sense amplifiers, each of which amplifies the data applied on a pair of the local I/O lines and transfers the amplified data to one read I/O line. The I/O sense amplifier outputs a voltage difference of the two I/O lines as a logic level.

In this embodiment, the data output part 20 may include an input driver (not shown), a latch unit, output pass gates PGR0 to PGR7, an output driver (not shown). The input driver senses and amplifies weak data potential applied on the data buses. The latch unit latches the inputted data. The output pass gates PGR0 to PGR7 outputs the latched data in response to control signals and the output driver amplifies the output data. However, the present invention is not limited to them.

Figure 5:
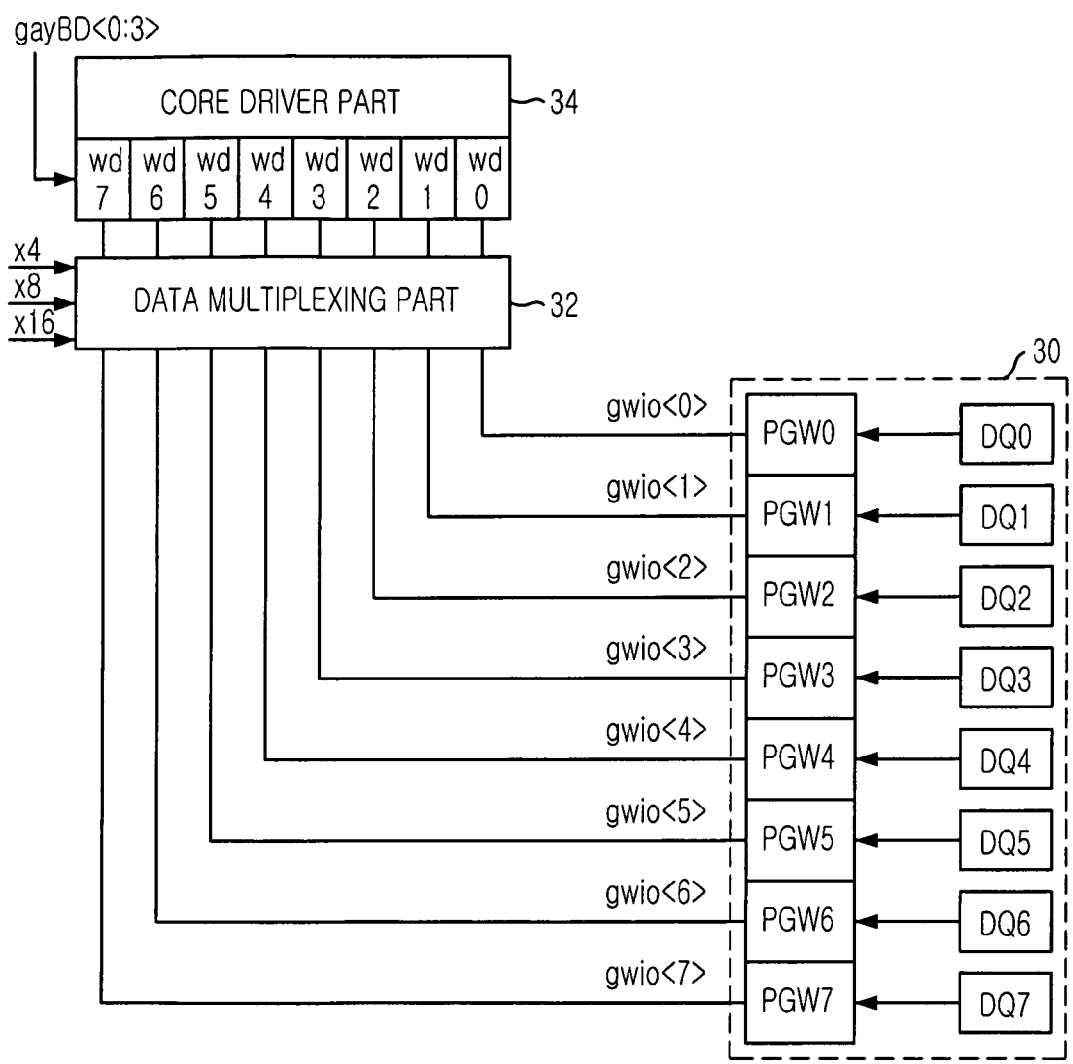
FIG. 5 is a circuit diagram of a read multiplexing part in accordance with an embodiment of the present invention.

FIG. 5 is a circuit diagram showing a part of the read multiplexing part and the core sense amplifier part in accordance with an embodiment of the present invention.

The multiplexing structure corresponding to four read I/O lines grio<0:3> is shown in FIG. 5. Accordingly, in this embodiment having sixteen read I/O lines, four circuits having the structure shown in FIG. 5 are required.

The read multiplexing part 22 has L input terminals and L output terminals, where L is $2^m$ (m=M, M−1, ..., M−K+1, M and K are positive integers). The read multiplexing part 22 is configured with (K−1) path having units 22-1 and 22-2. Except the minimum data width option signal, one data width option signal is designated to one path halving unit. When the path halving units 22-1 and 22-2 receive the designated data width option signals, the path halving units 22-1 and 22-2 connect the L input terminals to the L output terminals one by one. Meanwhile, when the path halving units 22-1 and 22-2 receive the undesignated data width option signals, the path halving units 22-1 and 22-2 connect two input terminals to one output terminal, such that L input paths are connected to L/2 output paths.

In accordance with an embodiment of the present invention, each of the path halving units 22-1 and 22-2 may be configured with a plurality of unit path halving units, each of which connects two input terminals to two output terminals if receiving the designated data width option signals and connects two input terminals to one output terminal if receiving the undesignated data width option signals. The number of the unit path halving units is determined depending on the number of the maximum data width and the number of the minimum data width. The maximum data width is gradually reduced half by half to reach the minimum data width. Therefore, the unit path halving units are required as many as the number of the result values at every halving steps. If the maximum data width is N and the minimum data width is M, the unit path halving units are required as many as (N/2+N/4+ . . . +M).

Each of the unit pass halving units includes two pass gates pg00 and pg01 and one AND gate. When the designated data width option signals are inputted, the two gates pg00 and pg01 connect each input terminal to each output terminal and the AND gate connects two input terminals to one output terminal.

In this case, in order for the AND gate to pass the data inputted through one of the two input terminals, the two input terminals must have high level when data are not inputted. For this purpose, the core sense amplifier part 24 must be configured such that the I/O sense amplifier part managing the non-selected internal I/O lines can maintain high level according to the path control signals gayBD<0:3>.

An operation of the data read path in accordance with the present invention will be described below with reference to FIGS. 4 and 5.

Referring to FIG. 5, when x16 data width option is selected, the pass gates pg00, pg01, pg02 and pg03 of the x8 pass halving unit 22-1 of the read multiplexing part 22 pass the data applied on sense amplifier output lines io_sa<0:3> through the designated read I/O lines grio<0:3>.

In the case of x8, the sense amplifiers of the core sense amplifier part 24 are alternately activated two by two in response to the path control signals gayBD<0:3>. The inactivated sense amplifiers output high level. The x8 pass halving unit 22-1 outputs data of the activated two sense amplifier output lines to the x8 output lines io_x8<0:1>, and data of the x8 output lines io_x8<0:1> are outputted to the two read I/O lines grio<0> and grio<2> by the x4 pass halving unit 22-2.

In the case of x4, the sense amplifiers of the core sense amplifier part 24 is activated one by one in response to the path control signals gayBD<0:3>. The inactivated sense amplifiers output high level. The x8 pass halving unit 22-1 outputs data of the activated sense amplifier output line to one of the x8 output lines io_x8<0:1>, and data of the x8 output lines io_x8<0:1> are outputted to one read I/O line grio<2> by the x4 pass halving unit 22-2.

In the case of the entire circuit having the maximum data width of 16, if the x16 data width option is selected, sixteen read I/O lines are used. If the x8 data width option is selected, eight read I/O lines are used because one read I/O line per two core I/O lines is used. If the x4 data width option is selected, four read I/O lines are used because one read I/O line per four core I/O lines is used.

Referring to FIG. 4, since there is an additional data multiplexing structure in the data output part 20, the data applied on the read I/O buses grio<0:15> are outputted to the data I/O pins DQ0 to DQ15 corresponding to the read I/O buses grio<0:15> regardless of the designated data width options.

Referring to FIG. 6, a write structure of a semiconductor memory device in accordance with an embodiment of the present invention includes a data input part 30, a write multiplexing part 32, and a main core driver part 34.

The data input part 30 transfers data applied on a plurality of data I/O pins to a core area through a write I/O bus. The write multiplexing part 32 multiplexes the data of the write I/O bus according to data width option. The main core driver part 34 transfers the output data of the write multiplexing part 32 to internal I/O bus of the core area.

Also, the core driver part 34 includes a plurality (preferably, the number of the maximum data width) of write drivers wd0 to wd7, each of which determines a logic level of the data applied on one write I/O line GIO and outputs an inverted level to a pair of core I/O lines GIO.

In this embodiment, the data input part 30 may include a plurality of data I/O pins DQ0 to DQ7, a plurality of data input buffers (not shown), a plurality of input pass gates PGW0 to PGW7, and a data input driver (not shown). The data input buffers buffer data applied on the data I/O pins DQ0 to DQ7. The input pass gates PGW0 to PGW7 receive the outputs of the data input buffers. The data input driver drives the outputs of the input pass gates PGW0 to PGW7 to the write I/O buses gio<0:15>. However, the present invention is not limited to them.

Figure 7:
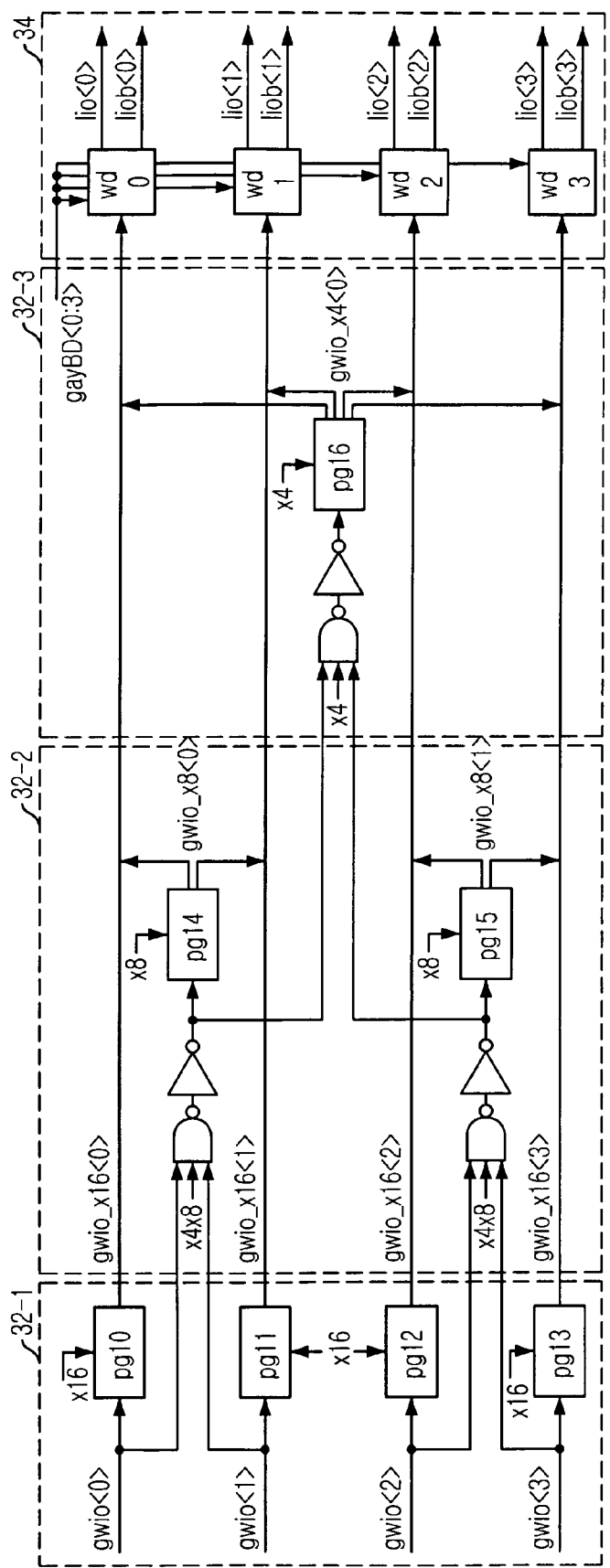
FIG. 7 is a circuit diagram of a write multiplexing part in accordance with an embodiment of the present invention.

FIG. 7 is a circuit diagram showing a part of the write multiplexing part and the core driver part in accordance with an embodiment of the present invention.

The multiplexing structure corresponding to four write I/O lines gwio<0:3> is shown in FIG. 7. Accordingly, in this embodiment having sixteen write I/O lines, four circuits having the structure shown in FIG. 7 are required.

The write multiplexing part 32 includes an x16 path distributing unit 32-1, an x8 path distributing unit 32-2, and an x4 path distributing unit 32-3. The x16 path distributing unit 32-1 connects the write I/O lines gwio<0:3> to four write drivers wd<0:3> in response to x16 option signal x16. The x8 path distributing unit 32-2 selectively connects two lines of the write I/O lines gwio<0:3> to the four write drivers wd<0:3> in response to x4/x8 option signal x4x8 and x8 option signal x8. The x4 path distributing unit 32-3 connects one line of the write I/O lines gwio<0:3> to the four write drivers wd<0:3> in response to the x4 option signal x4.

The x16 path distributing unit 32-1 includes four pass gates pg10, pg11, pg12 and pg13 for passing the data of the write I/O buses gwio<0:3> to the core driver part 34 in response to the x16 option signal x16, which is activated when the x16 data width option is selected.

The x8 path distributing unit 32-2 includes a NAND gate 701, an inverter 702, a pass gate pg14, a NAND gate 703, an inverter 704, and a pass gate pg15. The NAND gate 701 receives the x4/x8 option signal x4x8, which is activated when the x4 or x8 data width option is selected, and data applied on the write I/O buses gwio<0> and gwio<1>. The inverter 702 receives the output of the NAND gate 701. The pass gate pg14 passes the output of the inverter 702 in response to the x8 option signal x8, which is activated when the x8 data width option is selected. The NAND gate 703 receives the x4/x8 option signal x4x8 and data applied on the write I/O buses gwio<2> and gwio<3>. The inverter 704 receives the output of the NAND gate 703. The pass gate pg15 passes the output of the inverter 704 in response to the x8 option signal x8.

The x4 path distributing unit 32-3 includes a NAND gate 705, an inverter 706, and a pass gate pg16. The NAND gate 705 receives the x4 option signal x4, which is activated when the x4 data width option is selected, and the signals outputted from the inverters 702 and 704 of the x8 path distributing unit 32-2. The inverter 706 receives the output of the NAND gate 705. The pass gate pg16 selectively passes the output of the inverter 706 in response to the x4 option signal x4.

Meanwhile, the core driver part 34 includes four write drivers wd0, wd1, wd2 and wd3 for transferring the output of the write multiplexing part 32 to the core internal I/O lines lio<0:3> and liob<0:3> of the memory cell array in response to the path control signals gayBD<0:3>. Here, the output of the write multiplexing part 32 is one signal among the output signals gio__x16<0:3> of the x16 path distributing unit 32-1, the output signals gio__x8<0:1> of the x8 path distributing unit 32-2 and the output signal gio__x16<0> of the x4 path distributing unit 32-3.

If the x16 data width option is selected, all the write drivers of the core driver part 34 are activated whenever the data are inputted. If the x8 data width option is selected, the write drivers are activated two by two whenever the data are inputted. Meanwhile, if the x4 data width option is selected, the write drivers are activated one by one whenever the data are inputted.

An operation of the data write path in accordance with the present invention will be described below with reference to FIGS. 6 and 7.

Referring to FIG. 6, since there is an additional data multiplexing structure in the data input part 30, the data applied on the read I/O pins DQ0 to DQ15 are applied on the write I/O buses gwio<0:15> corresponding to the data I/O pins DQ0 to DQ15 regardless of the data width options.

Referring to FIG. 7, when the x16 data width option is selected, the pass gates pg10, pg11, pg12 and pg13 of the x16 path distributing unit 32-1 of the write multiplexing part 32 pass the data applied on all the write I/O buses gwio<0:3>. Meanwhile, when the x4 or x8 data width option is selected, the pass gates pg10, pg11, pg12 and pg13 block the data applied on all the write I/O buses gwio<0:3>.

At this time, the write drivers wd0, wd1, wd2 and wd3 of the core write driver part 34 receive the data gio__x16<0:3> from the x16 path distributing unit 32-1 and then transfer the data, which are inputted when the write drivers wd0, wd1, wd2 and wd3 are enabled in response to the path control signals gayBD<0:3>, to the core I/O lines lio<0:3> and liob<0:3> of the memory cell array.

In the case of x8, only two write I/O lines (for example, gwio<0> and gwio<2>) corresponding to the data I/O pins used among the four write I/O lines gwio<0:3> are activated, and the other write I/O lines maintain the logic high level. The x8 path distributing unit 32-2 transfers the data applied on one write I/O line gwio<0> of the activated write I/O lines to two write drivers wd0 and wd1, and transfers the data applied on the other write I/O line gwio<2> to other two write drivers wd2 and wd3. Among the two write drivers that receive the same data from one write I/O line, only one write driver selected in response to the path control signals gayBD<0:3> is driven to transfer the data to the corresponding core I/O line.

In the case of x4, only one write I/O line (for example, gwio<2>) corresponding to the data I/O pins used among the four write I/O lines gwio<0:3> is activated, and the other write I/O lines maintain the logic high level. The x4 path distributing unit 32-3 transfers the data applied on the activated write I/O line gwio<2> to the four write drivers wd0, wd1, wd2 and wd3. Among the two write drivers that receive the same data from one write I/O line, only the write driver selected in response to the path control signals gayBD<0:3> is driven to transfer the data to the corresponding core I/O line.

In the case of the entire circuit having the maximum data width of 16, if the x16 data width option is selected, sixteen write I/O lines are used. If the x8 data width option is selected, eight write I/O lines are used because one write I/O line per two core I/O lines is used. If the x4 data width option is selected, four write I/O lines are used because one write I/O line per four core I/O lines is used.

EMBODIMENT 2

In connecting the core area and the peripheral area, the semiconductor memory device in accordance with the first embodiment of the present invention utilizes the global I/O buses (the read I/O buses), which are used in the read operation, and the global I/O buses (the write I/O buses), which are used in the write operation. Meanwhile, a semiconductor memory device of FIG. 8 in accordance with a second embodiment of the present invention utilizes combination read and write global I/O buses to connect the core area and the peripheral area.

Figure 8:
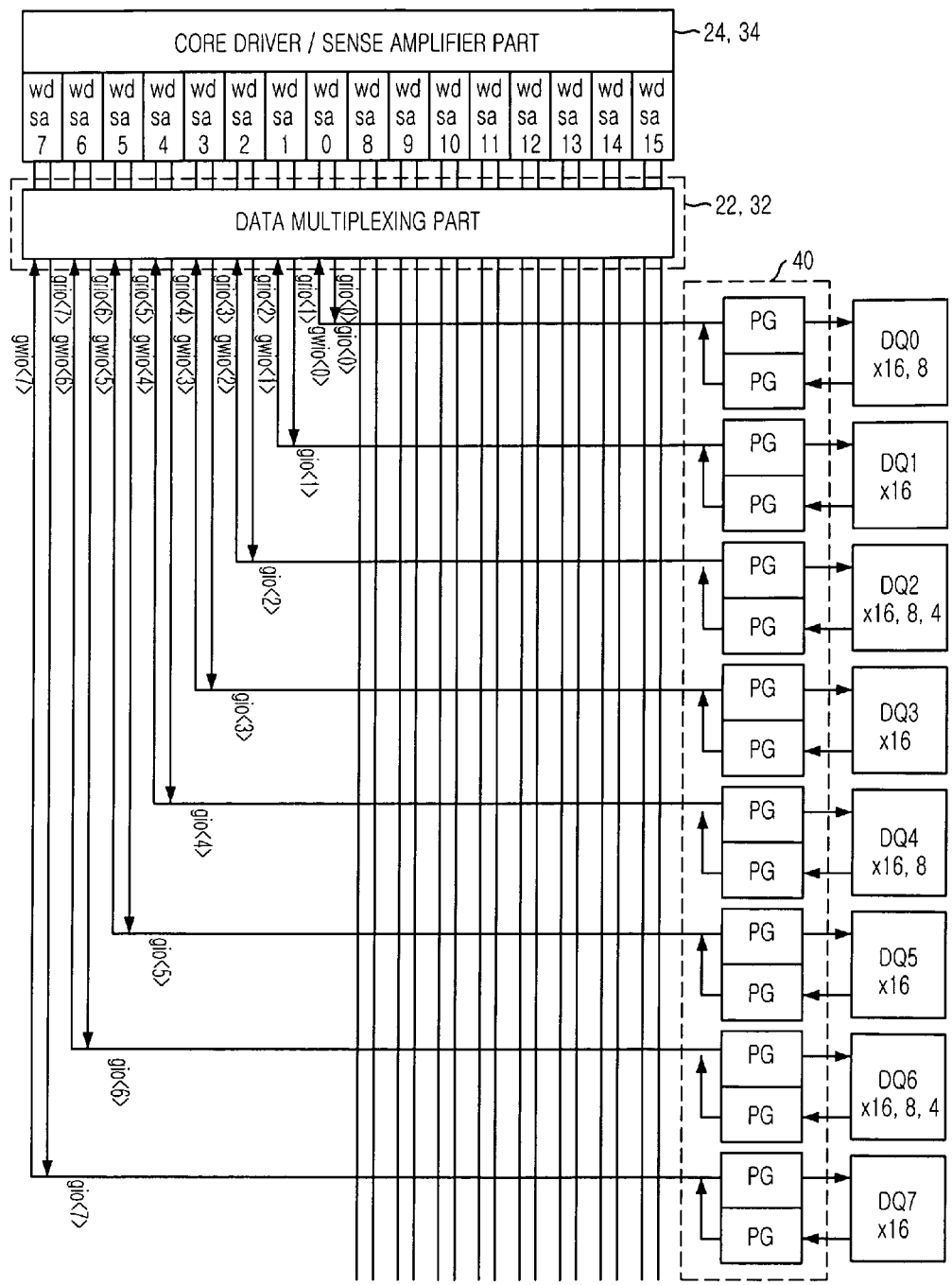
FIG. 8 is a block diagram illustrating a data I/O path of a semiconductor memory device in accordance with another embodiment of the present invention.

Referring to FIG. 8, a core driver/sense amplifier part can be divided into a core driver part 24 and a core sense amplifier part 34, and a read/write multiplexing part can be divided into a read multiplexing part 22 and a write multiplexing part 32. Likewise, a data input/output part 40 can be divided into a data input part and a data output part.

In this embodiment, since the global I/O buses are used for both the read (data output)/write (data input) operations, a data bus switching part must be provided at both ends of the global I/O buses so as to select the read or write path. In FIG. 8, a data bus switching part 42 for the core side is distinguished with a separate block, and a data bus switching part for the peripheral side is contained within the data input/output part 40.

In the read operation, the data bus switching part 42 for the core side connects the global I/O buses gio<0:15> to the read I/O buses grio<0:15>, which are connected to the read multiplexing part 22. In the write operation, the data bus switching part 42 connects the data buses gio<0:15> to the write I/O buses gwio<0:15>, which are connected to the write multiplexing part 32.

In the read operation, the data bus switching part for the peripheral side connects the data buses gio<0:15> to the read pass gates of the data I/O part 40. In the write operation, the data bus switching part for the peripheral side connects the data buses gio<0:15> to the write pass gates of the data I/O part 40.

Since the core sense amplifier part 24, the core driver part 34, the read multiplexing part 22 and the write multiplexing part 32 are equal to those of the first embodiment, a description thereof will be omitted.

EMBODIMENT 3

Figure 9:
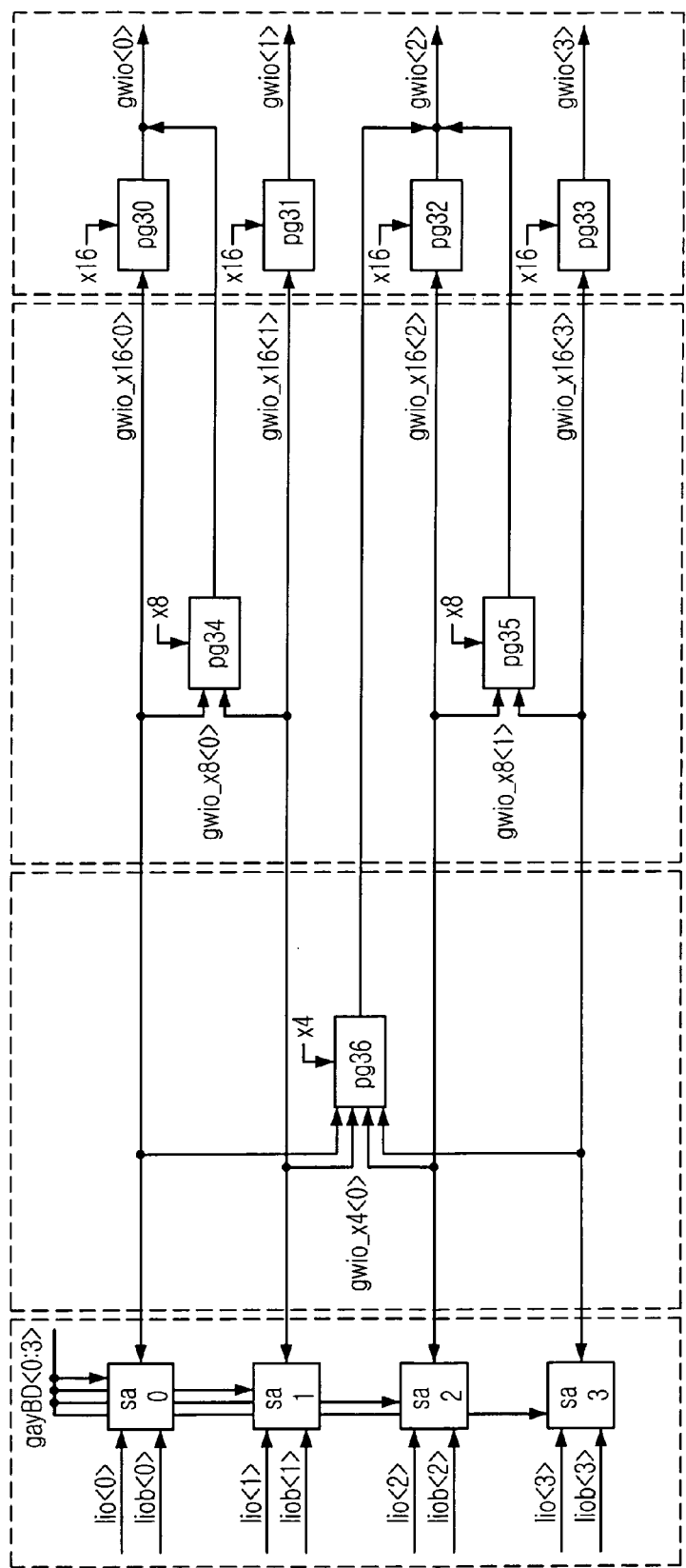
FIG. 9 is a circuit diagram of a read multiplexing part in accordance with another embodiment of the present invention.
Figure 10:
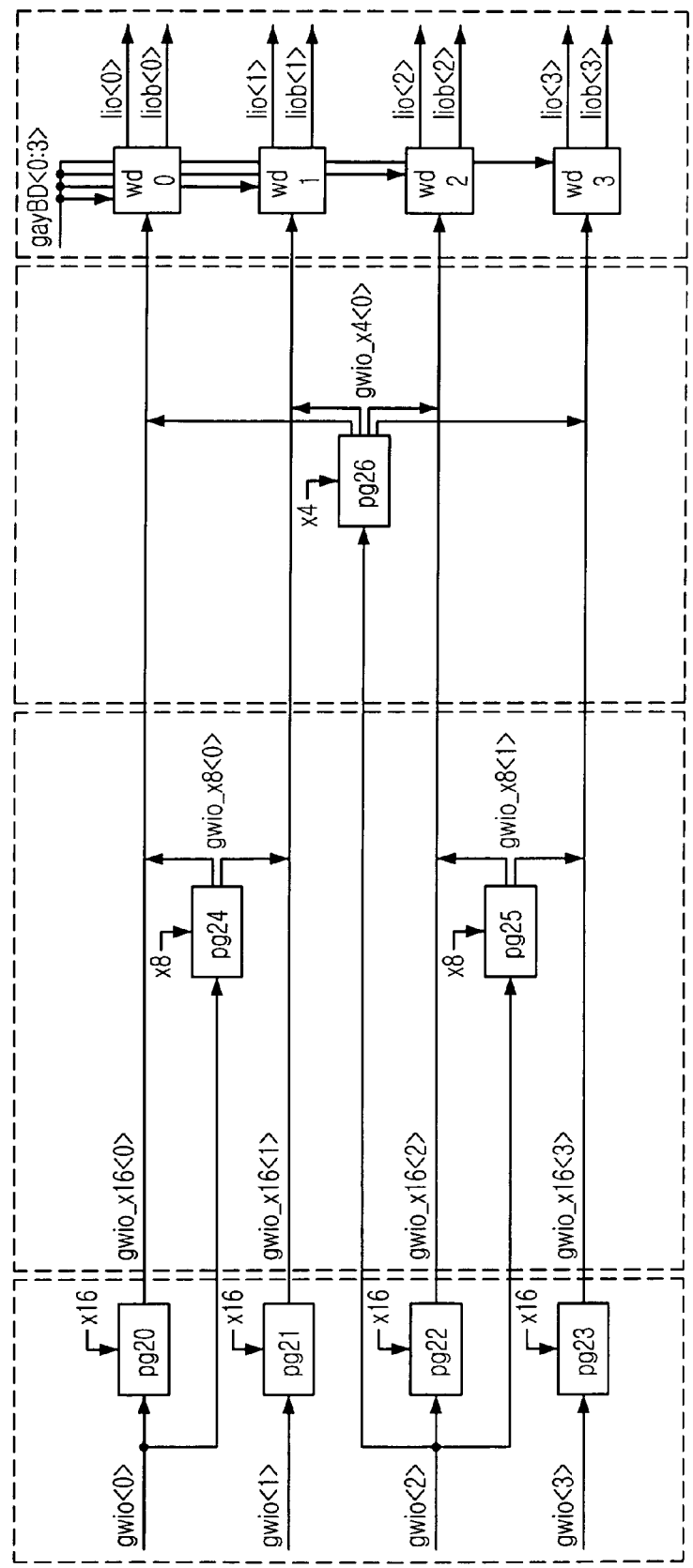
FIG. 10 is a circuit diagram of a write multiplexing part in accordance with another embodiment of the present invention.

A semiconductor memory device in accordance with a third embodiment of the present invention has a read structure and a write structure similar to the first embodiment. A difference is a detailed structure of the read multiplexing part and the write multiplexing part. Since the other elements are equal to those of the first embodiment, only the read multiplexing part and the write multiplexing part will be described in detail with reference to FIGS. 9 and 10.

In this embodiment, a semiconductor memory device has a maximum data width number $N(=2^P$, where P is positive integers), a minimum data width number $M(=2^Q$, where Q is positive integers), and $K(=P-Q+1)$ data width options.

The read multiplexing part includes a plurality of read passing blocks 62-1, 62-2 and 62-3 to which the data width option signals are designated. If the designated data width option signals are inputted, the read passing blocks 62-1, 62-2 and 62-3 pass the output of the core sense amplifier part to the data buses corresponding to the number of the designated data width. The read multiplexing part includes K read passing blocks 62-1, 62-2 and 62-3, where K is equal to the total number of the data width option.

As shown, the read multiplexing part has four input lines and four output lines and receives ×16, ×8 and ×4 option signals. The read multiplexing part includes the ×16 read passing block 62-1, the ×8 read passing block 62-2 and the ×4 read passing block 62-3.

The ×16 read passing block 62-1 is activated in response to the ×16 option signal and connects the four input lines to the four output lines one by one. The ×8 read passing block 62-2 is activated in response to the ×8 option signal and connects the four input lines to the four output lines two by two. Meanwhile, the ×4 read passing block 62-3 is activated in response to the ×4 option signal and connects the four input lines to one output line.

However, two or more input signals must not be inputted to one output line at the same time. It can be achieved by controlling the output timing of the sense amplifiers in response to the path control signals gayBD<0:3>.

The write multiplexing part includes a plurality of write passing blocks 72-1, 72-2 and 72-3 at every data width option. The data width option signals are designated to the write passing blocks 72-1, 72-2 and 72-3. If the designated data width option signals are inputted, the write passing blocks 72-1, 72-2 and 72-3 pass the data of the data buses corresponding to the number of the designated data width to the core driver part. The write multiplexing part includes K write passing blocks 72-1, 72-2 and 72-3.

As shown, the write multiplexing part has four input lines and four output lines and receives ×16, ×8 and ×4 option signals. The write multiplexing part includes the ×16 write passing block 72-1, the ×8 write passing block 72-2 and the ×4 write passing block 72-3.

The ×16 write passing block 72-1 is activated in response to the ×16 option signal and connects the four input lines to the four output lines one by one. The ×8 write passing block 72-2 is activated in response to the ×8 option signal and connects the four input lines to the four output lines two by two. Meanwhile, the ×4 write passing block 72-3 is activated in response to the ×4 option signal and connects the four input lines to one output line.

Although the same signals are inputted to the plurality of the output lines and the plurality of the write drivers, only one write driver transfers one input signal in response to the path control signals gayBD<0:3>.

EMBODIMENT 4

A semiconductor memory device in accordance with a fourth embodiment of the present invention has a read/write structure, whose read multiplexing part and write multiplexing part are equal to those of the second embodiment and whose read/write data bus is equal to the combination read/write data buses of the third embodiment. Therefore, a detailed description about them will be omitted.

According to the present invention, the data multiplexing structure on the data read and write paths can be more simplified, thereby reducing the layout area and the manufacturing cost.

Further, the timing mismatching in the data input/output can be prevented, thereby improving the reliability of the semiconductor memory device.

The present application contains subject matter related to Korean patent application No. 2004-58817, filed in the Korean Patent Office on Jul. 27, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
    a core sense amplifier part for amplifying data applied on data buses of a core area;
    a read multiplexing part for multiplexing the output data of the core sense amplifier part according to data width options and transferring the multiplexed data to a peripheral area through data buses; and
    a data output part for transferring the data of the data buses to a plurality of data I/O pins.

2. The semiconductor memory device as recited in claim 1, wherein the semiconductor memory device has a maximum data width number $N(=2^P$, where P is positive integers), a minimum data width number $M(=2^Q$, where Q is positive integers), and $K(=P-Q+1)$ data width options, wherein the read multiplexing part includes K path halving units,
    the path halving units being configured to connect L input lines to L output lines if the designated data width option signals are inputted, where $L=2^p$ (p is positive integers of P, P-1, . . . , P-K+1),
    the path halving units being configured to connect two input lines to one output line if non-designated data width option signals are inputted, such that the L input lines are connected to L/2 output lines.

3. The semiconductor memory device as recited in claim 2, wherein the path halving unit includes at least one unit path halving unit each of which has two input lines, the unit path halving unit including:
    two pass gates for connecting the two input lines to two output lines if the designated data width option signal is inputted; and
    a logic gate for connecting the two input lines to one output line if the non-designated data width option signal is inputted.

4. The semiconductor memory device as recited in claim 1, wherein the data output part includes:
    a plurality of data output pass gates for detecting data applied on the data buses and passing the detected data to data I/O pins; and
    the data I/O pins for applying the outputs of the data output pass gates to an exterior.

5. The semiconductor memory device as recited in claim 1, wherein the core sense amplifier part includes a plurality of sense amplifiers for receiving potentials applied on a pair of data lines of the core area and outputting logic level to one output line, the logic level being determined by the potential difference.

6. The semiconductor memory device as recited in claim 1, wherein the semiconductor memory device has a maximum data width number $N(=2^P$, where P is positive integers), a minimum data width number $M(=2^Q$, where Q is positive integers), and $K(=P-Q+1)$ data width options,
    the read multiplexing part including K read passing block configured to pass the output of the core sense amplifier part to data buses corresponding to a designated data width number if the designated data width option signal is inputted.

7. A semiconductor memory device comprising:
    a data input part for transferring data applied on a plurality of data I/O pins to a core area through data buses wherein the data input part and the data I/O pins are in a peripheral area;
    a write multiplexing part for multiplexing the data of the data buses according to data width options; and a core driver part for driving the output data of the write multiplexing part to data buses of the core area.

8. The semiconductor memory device as recited in claim 7, wherein the semiconductor memory device has a maximum data width number $N(=2^P$, where P is positive integers), a minimum data width number $M(=2^Q$, where Q is positive integers), and $K(=P-Q+1)$ data width options, the write multiplexing part including K write passing blocks configured to pass the data of the data buses corresponding to a designated data width number to the core driver part if the designated data width option signal is inputted.

9. A semiconductor memory device comprising a read structure and a write structure, wherein the read structure includes:

a core sense amplifier part for amplifying data applied on data buses of a core area;

a read multiplexing part for multiplexing the output data of the core sense amplifier part according to data width options and transferring the multiplexed data to a peripheral area through data buses; and a data output part for transferring the data of the data buses to a plurality of data I/O pins, wherein the write structure includes:

a data input part for transferring data applied on a plurality of data I/O pins to a core area through data buses;

a write multiplexing part for multiplexing the data of the data buses according to data width options; and a core driver part for driving the output data of the write multiplexing part to data buses of the core area.

10. The semiconductor memory device as recited in claim 9, wherein the semiconductor memory device has a maximum data width number $N(=2^P$, where P is positive integers), a minimum data width number $M(=2^Q$, where Q is positive integers), and $K(=P-Q+1)$ data width options, wherein the read multiplexing part includes K path halving units, the path halving units being configured to connect L input lines to L output lines if the designated data width option signals are inputted, where $L=2^p$ (p is positive integers of P, P−1, . . . , P−K+1), the path halving units being configured to connect two input lines to one output line if non-designated data width option signals are inputted, such that the L input lines are connected to L/2 output lines.

11. The semiconductor memory device as recited in claim 10, wherein the path halving unit includes at least one unit path halving unit each of which has two input lines, the unit path halving unit including:

two pass gates for connecting the two input lines to two output lines if the designated data width option signal is inputted; and a logic gate for connecting the two input lines to one output line if the non-designated data width option signal is inputted.

12. The semiconductor memory device as recited in claim 10, further comprising a data bus switching part for a peripheral side, wherein the data bus switching part connects the data buses to read pass gates of the data output part during a read operation, and connects the data buses to write pass gates of the data input part during a write operation.

13. The semiconductor memory device as recited in claim 9, wherein the data output part includes:

a plurality of data output pass gates for detecting data applied on the data buses and passing the detected data to data I/O pins; and the data I/O pins for applying the outputs of the data output pass gates to an exterior.

14. The semiconductor memory device as recited in claim 9, wherein the core sense amplifier part includes a plurality of sense amplifiers for receiving potentials applied on a pair of data lines of the core area and outputting logic level to one output line, the logic level being determined by the potential difference.

15. The semiconductor memory device as recited in claim 9, wherein the semiconductor memory device has a maximum data width number $N(=2^P$, where P is positive integers), a minimum data width number $M(=2^Q$, where Q is positive integers), and $K(=P-Q+1)$ data width options, the read multiplexing part including K read passing block configured to pass the output of the core sense amplifier part to data buses corresponding to a designated data width number if the designated data width option signal is inputted.

16. The semiconductor memory device as recited in claim 9, wherein the semiconductor memory device has a maximum data width number $N(=2^P$, where P is positive integers), a minimum data width number $M(=2^Q$, where Q is positive integers), and $K(=P-Q+1)$ data width options, the write multiplexing part including K write passing blocks configured to pass the data of the data buses corresponding to a designated data width number to the core driver part if the designated data width option signal is inputted.

17. The semiconductor memory device as recited in claim 9, wherein the data input part includes:

a plurality of data I/O pins;

a plurality of data input buffers for buffering data applied on the plurality of data I/O pins;

a plurality of pass gates configured to receive the outputs of the data input buffers; and a data input driver for driving the plurality of data buses in response to the outputs of the pass gates.

18. The semiconductor memory device as recited in claim 9, wherein the core driver part includes a plurality of write drivers for receiving a signal applied on one input line and outputting the signal as potential difference of a pair of data lines contained in the core area.

19. The semiconductor memory device as recited in claim 9, further comprising a data bus switching part for a core side, wherein the data bus switching part connects the data buses to data buses of the read multiplexing part during a read operation, and connects the data buses to data buses of the write multiplexing part during a write operation.

* * * * *